(12) United States Patent
Stothert et al.

(10) Patent No.: US 7,539,604 B1
(45) Date of Patent: May 26, 2009

(54) AUTOMATIC MODIFICATION OF THE BEHAVIOR OF SYSTEM FROM A GRAPHICAL REPRESENTATION OF THE BEHAVIOR

(75) Inventors: Alec Stothert, Westborough, MA (US); Craig Buhr, Westborough, MA (US); Anthony Lennon, Grafton, MA (US); Pascal Gahinet, Hopkinton, MA (US)

(73) Assignee: The MathWorks, Inc., Natick, MA (US)

( * ) Notice: Subject to any disclaimer, the term of this patent is extended or adjusted under 35 U.S.C. 154(b) by 556 days.

(21) Appl. No.: 11/253,137

(22) Filed: Oct. 17, 2005

(51) Int. Cl.
    *G06F 9/455* (2006.01)
(52) U.S. Cl. .................. 703/6; 703/1; 703/7; 703/10; 717/126; 700/182; 345/440
(58) Field of Classification Search .............. 703/2, 703/7, 10, 13; 717/127, 130, 106, 168; 235/462.32; 345/156, 440, 629; 702/182; 166/250.15; 700/83
    See application file for complete search history.

(56) References Cited

U.S. PATENT DOCUMENTS

| | | | |
|---|---|---|---|
| 6,209,788 B1* | 4/2001 | Bridgelall et al. ...... | 235/462.32 |
| 2003/0122826 A1* | 7/2003 | Eryilmaz et al. ............ | 345/440 |
| 2005/0080592 A1* | 4/2005 | Buscema et al. ............ | 702/182 |
| 2005/0091647 A1* | 4/2005 | McCollum et al. .......... | 717/130 |
| 2005/0096894 A1* | 5/2005 | Szpak et al. ................... | 703/13 |
| 2005/0173114 A1* | 8/2005 | Cudmore et al. ........ | 166/250.15 |
| 2005/0193376 A1* | 9/2005 | Harrison ..................... | 717/127 |
| 2005/0273302 A1* | 12/2005 | Huang et al. .................. | 703/10 |
| 2006/0061547 A1* | 3/2006 | Bramwell et al. ........... | 345/156 |
| 2006/0112382 A1* | 5/2006 | Glass et al. ................. | 717/168 |
| 2006/0139372 A1* | 6/2006 | Orofino, II .................. | 345/629 |
| 2006/0167669 A1* | 7/2006 | Cariveau et al. ............... | 703/7 |
| 2006/0200795 A1* | 9/2006 | MacLay ..................... | 717/106 |
| 2006/0235548 A1* | 10/2006 | Gaudette ..................... | 700/83 |
| 2007/0018986 A1* | 1/2007 | Hauser ....................... | 345/440 |
| 2007/0074286 A1* | 3/2007 | Wendling .................... | 726/21 |

OTHER PUBLICATIONS

VisSim/OptimizerPRO™6, retrieved online at: http://www.vissim.com/products/datasheets/Optimize6.pdf.
Simulink® Response Optimization 2, retrieved online at: https://tagteamdbserver.mathworks.com/ttserverroot/Download/26028_91202v00_SL_response_opt.pdf.

* cited by examiner

*Primary Examiner*—Paul L Rodriguez
*Assistant Examiner*—Kandasamy Thangavelu
(74) *Attorney, Agent, or Firm*—Lahive & Cockfield, LLP; Kevin J. Canning

(57) ABSTRACT

The present invention provides a method of modifying the behavior of a modeled system from a graphical representation of the behavior of the system. Given a graphical representation of the behavior of a modeled system, one or more bounds may be selected for the behavior on the graphical representation. The necessary parameters for the modeled system are then determined for producing the desired behavior based on the selected bounds for the behavior.

68 Claims, 4 Drawing Sheets

AUTOMATIC MODIFICATION OF THE BEHAVIOR OF SYSTEM FROM A GRAPHICAL REPRESENTATION OF THE BEHAVIOR

FIELD OF THE INVENTION

The present invention relates to a modeling environment for modeling a system. More particularly, the present invention relates to being able to modify the behavior of a system from the graphical representation of the behavior of the system.

BACKGROUND OF THE INVENTION

Many organizations are embracing the paradigm of Model Based Development in their production processes. "Model Based Development" refers to the practice of specifying, analyzing, and implementing systems using a common "model" containing a set of block diagrams and associated objects. System implementation typically entails automatically generating code for portions of the model, particularly portions corresponding to the system's control algorithm.

Graphical modeling environments are an example of software applications that may enable a user to model dynamic systems i.e., systems whose outputs change over time, using a graphical model, such as a block diagram. Some graphical modeling environments also enable simulation and analysis of models. Simulating a dynamic system in a graphical modeling environment is typically a two-step process. First, a user creates a graphical model, such as a block diagram, of the system to be simulated. A graphical model may be created using a graphical user interface, such as a graphical model editor. The graphical model depicts time-based relationships between the systems inputs, states, parameters and outputs. After creation of the graphical model, the behavior of the dynamic system over a specified time period is simulated using the information entered into the graphical model. In this step, the graphical model is used to compute and trace the temporal evolution of the dynamic systems' outputs ("execute the graphical model"), and automatically produce either deployable software systems or descriptions of hardware systems that mimic the behavior of either the entire model or portions of the model (code generation).

Block diagrams are graphical entities having an "executable meaning" that are created within graphical modeling environments for modeling a dynamic system, and generally comprise one or more graphical objects. For example, a block diagram model of a dynamic system is represented schematically as a first collection of graphical objects, such as nodes, which are interconnected by another set of graphical objects, generally illustrated as lines, which represent logical connections between the first collection of graphical objects. In most block diagramming paradigms, the nodes are referred to as "blocks" and drawn using some form of geometric object (e.g., circle, rectangle, etc.). The line segments are often referred to as "signals". Signals correspond to the time-varying quantities represented by each line connection and are assumed to have values at each time instant. Each node may represent an elemental dynamic system, and the relationships between signals and state variables are defined by sets of equations represented by the nodes. Inherent in the definition of the relationship between the signals and the state variables is the notion of parameters, which are the coefficients of the equations. These equations define a relationship between the input signals, output signals, state, and time, so that each line represents the input and/or output of an associated elemental dynamic system. A line emanating at one node and terminating at another signifies that the output of the first node is an input to the second node. Each distinct input or output on a node is referred to as a port. The source node of a signal writes to the signal at a given time instant when its system equations are solved. The destination node of this signal read from the signal when their system equations are being solved. In other instances the connections between nodes are non-causal. That is, the line connecting the first node to the second node does not necessarily mean an output is being provided from the first node to the second node as an input. An example of non-causal connections can be found in electrical circuits in which there is no computational directionality. In physical systems, non-casual connections often imply that one set of variables are equal (such as voltage in an electrical circuit) while another set of variables sum to zero (such as current in an electrical circuit). Those skilled in the art will recognize that the term "nodes" does not refer exclusively to elemental dynamic systems but may also include other modeling elements that aid in readability and modularity of block diagrams.

When modeling a system, the behavior of the system or part of the system is often monitored to determine the performance of the system. The behavior of a system is often monitored using a graphical representation of the behavior for the system. Examples of behaviors include the time domain and frequency domain responses of the modeled system. The behavior of the system is based at least in part on the parameters of the system. The parameters of a system are the coefficients of the equations that define the system. By adjusting the parameters, the equation is adjusted and thus the behavior of the system. When designing a system it is often desired to have the behavior of the system have certain characteristics such as a minimum or maximum value. The behavior of the modeled system can be changed by modifying at least one parameters of the system. Typically this is performed using trial and error method of controlling the parameters to dictate the behavior. That is, a user adjusts the parameters in an attempt to have the resultant behavior match the desired characteristics. This can be tedious and time consuming and increases in difficulty as the number of parameters and behaviors to be modified increases. What is needed is a simpler way of modifying the behavior of a system, for example, a way of controlling the behavior to dictate the parameters.

SUMMARY OF THE INVENTION

The present invention provides a method of modifying the behavior of a modeled system from a graphical representation of the behavior of the system. Given a graphical representation of the behavior of a modeled system, a user may set one or more bounds for the behavior on the graphical representation. The necessary parameters are then determined for producing the desired behavior based on the set bounds for the behavior.

In accordance with a first aspect, in a graphical modeling environment, a method is provided for modifying a system from a graphical representation of the behavior of the system. The method includes providing a graphical representation of the behavior of a modeled system. The modeled system has at least one parameter that at least in part determines the behavior of the system. Then at least one bound is selected for the graphical representation of the behavior of the modeled system. The deviation of the behavior from the bound is calculated. Vertical, horizontal, and proximity measures are selected for deviation. At least one parameter of the modeled system is then modified based on the deviation of the graphical representation of the behavior of the modeled system. In some embodiments multiple bounds are selected for the behavior. In such embodiments, the bounds may be weighted.

In some aspects, the graphical representation of the behavior of a modeled system can include time domain response, frequency characteristics, pole-zero location, and state space. There may also be multiple graphical representations including any number of possible combinations of different graphical representations wherein one or more bounds are selected for each graphical representation of a behavior. The parameters are then modified based on the selected bounds for each graphical representation.

In certain aspects, modifying at least one parameter based on the selected bound(s) involves requesting from the modeled system the behavior given specific parameter values and evaluating the deviation given a specific behavior; and determining a set of parameter values that adjust the deviation.

In accordance with another aspect, a medium for use with a computing device is provided. The medium holds instructions executable by the computing device for performing a method. The method involves generating a graphical representation of the behavior of a modeled system, the modeled system having at least one parameter that at least in part determines the behavior of the system; selecting at least one bound for the graphical representation of the behavior of the modeled system; computing the deviation of the behavior from the bound, wherein the deviation is selected from the group comprising vertical, horizontal, and proximity measures; and modifying at least one parameter of the modeled system based on the deviation of the graphical representation of the behavior of the modeled system.

In accordance with another aspect, a system for generating and displaying a physical modeling application is provided. The system includes user-operable input means for inputting data to the physical modeling application; a display device for displaying a physical model; and a computing device. The computing device includes memory for storing computer program instructions and data, and a processor for executing the stored computer program instructions. The computer program instructions include instructions for providing a graphical representation of the behavior of a modeled system wherein the modeled system has at least one parameter that at least in part determines the behavior of the system; selecting at least one bound for the graphical representation of the behavior of the modeled system; computing the deviation of the behavior from the bound, wherein the deviation is selected from the group comprising vertical, horizontal, and proximity measures; and modifying at least one parameter of the modeled system based on the deviation of the graphical representation of the behavior of the modeled system.

In accordance with another aspect, in a network having a server, executing a physical modeling environment, and a client device in communication with the server, a method is provided. The method involves providing, at the server, a graphical representation of the behavior of a modeled system, the modeled system having at least one parameter that at least in part determines the behavior of the system; receiving, at the server from the client device, a selection of a one or more bounds for the graphical representation of the behavior of the modeled system; computing the deviation of the behavior from the bound, wherein the deviation is selected from the group comprising vertical, horizontal, and proximity measures; and modifying at least one parameter of the modeled system based on the deviation of the graphical representation of the behavior of the modeled system.

DETAILED DESCRIPTION OF AN ILLUSTRATIVE EMBODIMENT

An illustrative embodiment of the present invention relates to a method of modifying a modeled system from a graphical representation of the behavior of the system. The present invention will be described relative to illustrative embodiments. Those skilled in the art will appreciate that the present invention may be implemented in a number of different applications and embodiments and is not specifically limited in its application to the particular embodiments depicted herein.

Figure 1:
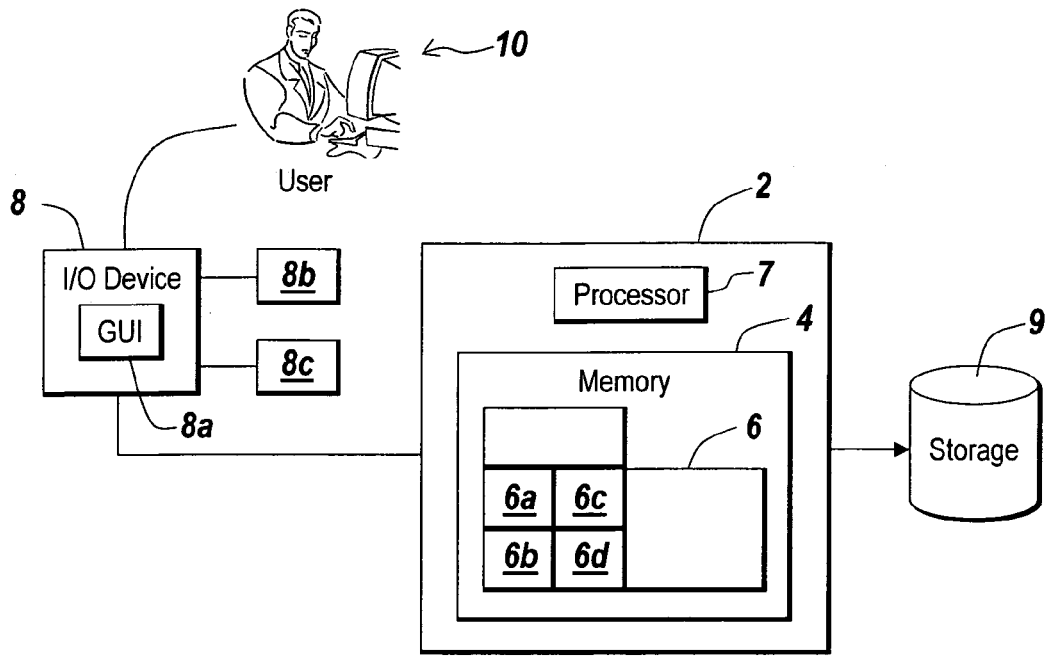
FIG. 1 illustrates an environment suitable for practicing an illustrative embodiment of the present invention.

FIG. 1 depicts an environment suitable for practicing an illustrative embodiment of the present invention. A computing device 2 includes memory 4, on which software according to one embodiment of the present invention is stored, a processor (CPU) 7 for executing software stored in the memory, and other programs for controlling system hardware. Typically, the interaction of a human user with the computing device 2 occurs through an input/output (I/O) device 8, such as a graphical user interface (GUI). The I/O device 8 may include a display device 8a (such as a monitor) and an input device (such as a mouse 8b and a keyboard 8c and other suitable conventional I/O peripherals.

For example, the memory 4 holds a modeling application 6 capable of creating and simulating digital versions of system models, such as block diagrams, state diagrams, signal diagrams, flow chart diagrams, sequence diagrams, UML diagrams, dataflow diagrams, circuit diagrams, ladder logic diagrams, kinematic element diagrams, or other models, which may be displayed to a user 10 via the display device 8a. In the illustrative embodiment, the modeling application 6 comprises a MATLAB modeling environment, such as Simulink® or another suitable modeling environment. As used herein, the terms "modeling environment" and "physical modeling environment" refer to an application where a model, such as a model of a physical system, is created and translated into executable instructions. Examples of suitable modeling applications include, but are not limited to MATLAB, including Simulink, SimMechanics, and SimDriveline from the MathWorks, Inc.; LabVIEW, DasyLab and DiaDem from National Instruments Corporation, VEE from Agilent, SoftWIRE from Measurement Computing, VisSim from Visual Solutions, SystemVIEW from Elanix, WiT from Coreco, Vision Program Manager from PPT Vision, Khoros from Khoral Research, and numerous others. The memory 4 may comprise any suitable installation medium, e.g., a CD-ROM, floppy disks, or tape device; a computer system memory or random access memory such as DRAM, SRAM, EDO RAM, Rambus RAM, etc.; or a non-volatile memory such as a magnetic media, e.g., a hard drive, or optical storage. The memory may comprise other types of memory as well, or combinations thereof.

In an alternate embodiment, the computing device 2 is also interfaced with a network, such as the Internet. Those skilled in the art will recognize that the diagrams used by the diagramming application 6 may be stored either locally on the computing device 2 or at a remote location 9 interfaced with the computing device over a network. Similarly, the diagramming application 6 may be stored on a networked server or a remote peer.

The modeling application 6 of an illustrative embodiment of the invention includes a number of generic components. Although the discussion contained herein focuses on MATLAB from The MathWorks, Inc. of, Natick Mass., those skilled in the art will recognize that the invention is applicable to other software applications. The generic components of the illustrative diagramming program 6 include a model editor 6a for specifying models of dynamic systems. The model editor 6a allows users to perform such actions as construct, edit, display, annotate, save, and print out a model that represents a physical system. The illustrative diagramming application 6 also includes elements libraries 6b that contain elements that may be combined to model systems. There may also be a graphical aspect 6c that allows graphical modeling. An execution engine 6d, also implemented in the application, is used to process a model to produce simulation results or to convert the model to executable code. The execution engine 6d translates a model to executable entities. The executable entities are compiled and executed on a computational device, such as a computer, to implement the functionality specified by the model. Typically, the code generation preserves a model hierarchy in a call graph of the generated code. For instance, each subsystem of a model in a physical modeling environment can map to a user specified function and the generated code. Real-Time Workshop from the MathWorks, Inc. of Natick, Mass. is an example of a suitable execution engine 6d for generating code.

In the illustrative embodiment, the modeling program 6 is implemented as a companion program to a technical computing program, such as MATLAB, also available from the MathWorks, Inc.

The model editor 6a is the component that allows a user to create and modify a model representing a physical system. The model editor 6a also allows a user to create and store data relating to model element 6b. A textual interface with a set of commands allows interaction with the model editor. Using this textual interface, users may write special scripts that perform automatic editing operations on the model. A user generally interacts with a set of windows that act as canvases for the model. There is generally more than one window for a model because models may be partitioned into multiple hierarchical levels through the use of subsystems.

Once a model has been constructed using the editor 6a, the execution engine 6d simulates the model by solving equations defined by the model to trace the system outputs as a function of time. The solution of the model, which may be referred to as model execution, is carried out over a user-specified time span for a set of user-specified inputs.

Figure 2:
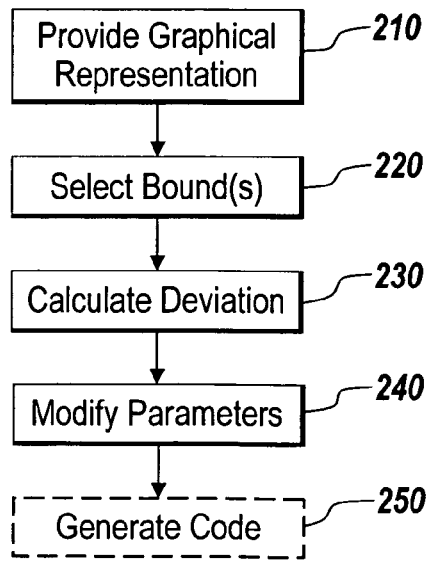
FIG. 2 is an exemplary flowchart of a method of modifying a modeled system from a graphical representation of the systems behavior.

According to an illustrative embodiment of the invention, a modeled system can be modified from a graphical representation of the behavior of the system. FIG. 2 depicts an exemplary flow chart 200 of a method of the present invention. The method comprises the steps of providing a graphical representation of the behavior of a modeled system 210, selecting at least one bound for the graphical representation of the behavior of the modeled system 220, computing the deviation of the behavior from the bound, wherein the deviation is selected from the group comprising vertical, horizontal, and proximity measures 230, and modifying at least one parameter of the modeled system based on the deviation for the graphical representation of the behavior of the modeled system 240. In certain embodiments the method may further include the step of generating code from the modified modeled system 250. These steps and their interrelation are described in more detail below.

The graphical representation of the behavior of the modeled system can be a plot such a time or frequency domain response. Additional graphical representations of the modeled systems behavior can include, but are not limited to, step response plots, impulse response plots, pole-zero plots, Bode plots, Nichols plots, Nyquist plots, state space plots or the likes. Other possible graphical representations will be apparent to one skilled in the art given the benefit of this disclosure.

Figure 3:
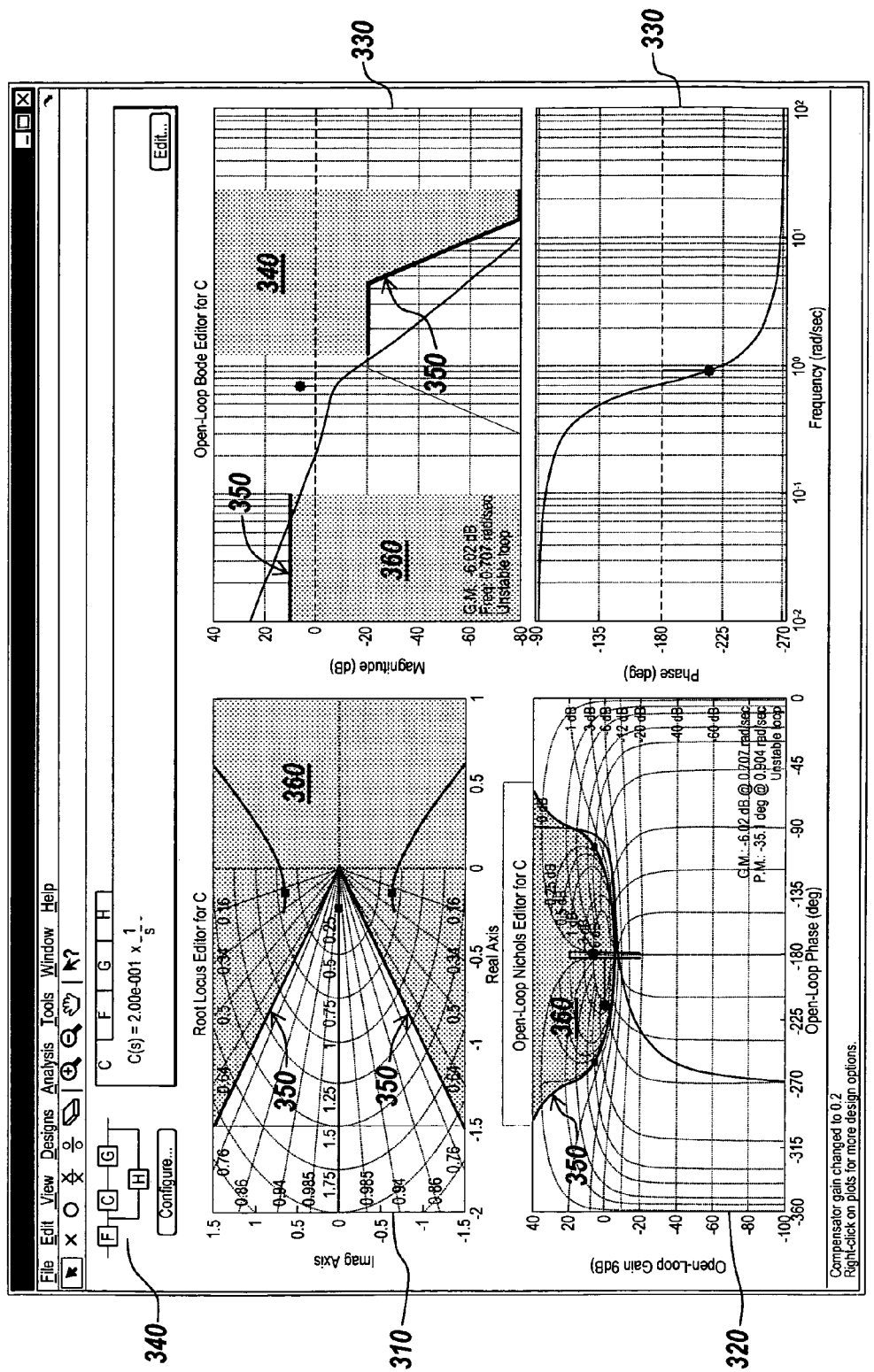
FIG. 3 is an illustrative embodiment of collection of graphical representations of the behavior of a modeled system.

In some embodiments, multiple graphical representations of the behavior of the system may be provided. FIG. 3 an example wherein multiple graphical representations of a modeled system are provided. Here the graphical representations are a Root Locus plot (imaginary v. real) 310, an Open-loop Nichols plot (gain v. phase) 320, and a bode plot (magnitude v. frequency and phase v. frequency) 330. It should be noted that, although three graphical representations are provided in this example, there may be any number of graphical representations. In some embodiments, the number and type of graphical representations provided may be selected by a user. In some such embodiments the selection is made using a graphical user interface (GUI), for example, using a pull down menu. In other embodiments which graphical representations and how many are to be provided is determined by the computing device or software running on the computing device.

Figure 4:
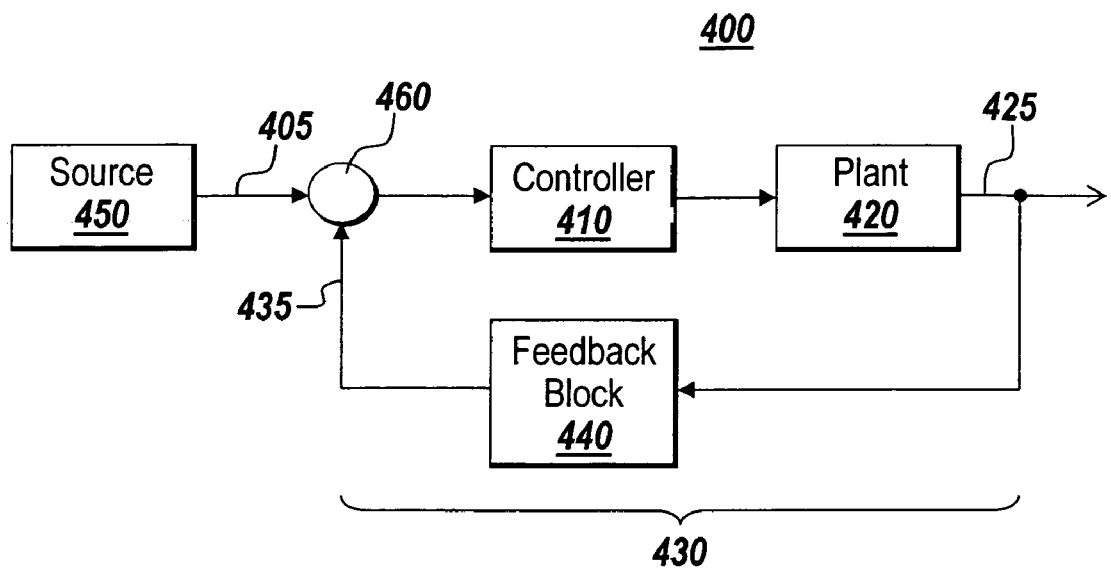
FIG. 4 is an example of a graphical model of a control system of which the behavior of is depicted in FIG. 3.

As discussed above, the provided graphical representation(s) are of the behavior of a modeled system. The modeled system has parameters that at least in part determine the behavior of the system. The graphical representations of FIG. 3 are for the behavior of the modeled system 400 shown in FIG. 4. The modeled system 400 of FIG. 4 is a control system. The control system includes a controller 410, a plant 420, and a feedback loop 430. The controller 410 provides for the control of the system. The controller 410 provides the parameters that may be modified or adjusted to affect the behavior of the system. The plant 420 models the properties of the system outside the control of the designer. The uncertainties of the system are represented by the plant 420. The output from the controller 410 affects the operation of the plant 420 which in turn affects the operation of the system 400. The feedback loop 430 provides the output of the system 425 back to the controller 410. The feedback loop may also have some properties that affect the performance of the system. In this example those properties are modeled by a sensor model block 440. In this example a source block 450 is provided to model the input 405 for the control system 400. The input 405 is combined with the output 435 of the feedback loop 430 at a summer 460. The combined signal 415 is provided to the controller 410 allowing for further adjustment to the response of the system. A graphical representation of this system 340 can also be seen in FIG. 3. In the graphical representation of Figure, the source 450 is represented by block F, the controller 410 by block C, the plant 420 by block G, and the properties of the sensor model 440 by block H.

It should be noted that even though the exemplary modeled system of FIG. 4 is a feedback loop, modeled systems of the present invention are not limited to this configuration. Modeled systems can have any number of inputs and outputs which in may be monitored via the graphical representation of the behavior of the system. Examples of other possible modeled systems include, but are not limited to, filters, industrial processes, mechanical systems, thermodynamic systems, hydraulic systems, and electromagnetic systems. It should also be noted that the model need not be a graphical model. For example, it may be a textual model defining the properties of the system. Other possible applications and configuration will be apparent to one skilled in the art given the benefit of this disclosure.

Referring back to FIG. 2, the second step is selecting a bound for the graphical representation of the behavior of the modeled system (step 220). A bound is a boundary for the behavior of the graphical representation. The bound may be a maximum or minimum value for the behavior. In some embodiments the bound is a linear bound. In certain embodiments the bound is a piecewise linear bound. A piecewise linear bound is made up of 2 or more linear bounds. As such, the piece-wise linear bound may have any number of shapes that can apply boundaries upon multiple aspects of the graphical representation of the behavior. Other possible implementation and applications will be apparent to one skilled in the art given the benefit of the disclosure.

In some embodiments multiple bounds may be selected. As such, boundaries on the behavior may be placed on different parts of the graphical representation of the behavior. In embodiments where there are multiple graphical representations one or more bounds may be selected for each representation. An example of selected bounds 350 can be seen in FIG. 3. In this example, one or more bounds 350 have been selected for the provided graphical representations. In this embodiment the bounds 350 are directional. That is, the bounds 350 define an area that is outside the operation range for the behavior. In this example that is the shaded area 360 defined by the bounds 350. The un-shaded area on one side of the bound 350 is the desired operational range for the behavior while the shaded area on the other side of the bound 350 indicated a region that is outside the desired operational range of the behavior.

A bound may be placed on the graphical representation of the behavior of the modeled system by using a graphical interface such as a graphical user interface (GUI). In the present example, this is performed by selecting to place a bound, for example from a pull down menu, and then placing the bound on the graphical representation. In the case where the bound is a piecewise linear bound, a user selects point to point the defined by the piece-wise shape of the bound. The directionality of the bound may also be selected using the GUI. In the present example the default directionality of the bound is above and to the right of the bound, but the user may select, using a GUI such as a pull down menu or a right click menu, to switch this orientation. Although this example has focused on a user selecting bounds for the behavior, it should be noted in some embodiments, the graphical modeling environment, or other software operating on the computing device may select one or more bounds for the behavior.

In certain embodiments wherein multiple bounds are selected the bounds may be weighted to provide priority when processing the bounds. For example, in FIG. 3 a user may decide that behavior being bounded in the Open-loop Bode plot 330 is the most important behavior to be controlled. As such a greater weight can be assigned to those bounds. The adding of weighting to a bound may be performed using Graphical user interface (GUI) such as a pull down or right click menu. In other embodiments weighting may be assigned or applied by the graphical modeling environment or other software operating on the computing device.

Once a bound is selected for the graphically represented behavior then the deviation of the behavior from the bound is then calculated (step 230). The deviation of the model response from the bound can be calculated in a number of different ways. Consider for example a graphical representation of the model behavior on a two dimensional plot, with X and Y axes. The deviation of the model behavior from the bound can be calculated as the difference between the behavior and the bound in a vertical direction (fixed X value); in a horizontal direction (fixed Y value); or proximal (closest distance between bound and behavior).

In some embodiments the selected measure of the deviation (i.e. vertical, horizontal, or proximal) is determined by the user. For example, selection of a measure for the deviation may be performed using a Graphical User Interface (GUI) such as a menu system. In other embodiments, the selected measure of deviation is determined by the graphical representation of the behavior for the system.

The parameter of the modeled system can then be modified based on the deviation for the behavior (step 240). The idea is to make the behavior of the graphical representation comply with the selected bounds by adjusting the parameters of the modeled system. The deviation determines how close the behavior is to the selected bound. The selected bound or bounds have established desired operational limits for the behavior, such as minimum or maximum values, and now the parameters of the system are modified in an attempt to achieve the desired operation behavior that complies with the selected bounds by adjusting the deviation of the behavior from the bound. In some embodiments this may involve multiple iterations of adjusting a parameter and comparing the resulting behavior to the selected bound(s) to determine the deviation. Using such a technique the modeled system can be optimized for desired behavior characteristics.

In the example of FIG. 4, wherein the modeled system is a feedback loop, the parameters of the system that will be modified are the parameters of the controller. Examples of parameters that may be modified may include, but are not limited to impedance, capacitance, delay, gain, length, weight, density, and curvature. The type and number parameters depend on the type of system being modeled. Other possible implementations and embodiments will be apparent to one skilled in the art given the benefit of this disclosure.

In some embodiments, a selection may be made as to which parameters are to be modified. For example, it may be desirable to "lock in" one or more parameters so that they are not modified. This may reflect a real world constraint of having to use certain components having fixed values. Likewise, a user may wish to set a possible range for a parameter, wherein modification or adjustment of parameters has an upper or lower limit to reflect the available components ranges. In other embodiments, parameters may be limited to a fixed set of values, such as true/false or {1, 2, 3}. In some embodiments the selection of which parameters are to be modified or ranges for parameters may be performed using a graphical user interface (GUI). In other embodiments the selection is performed by the graphical modeling environment or other software operating on the computing device.

Figure 5:
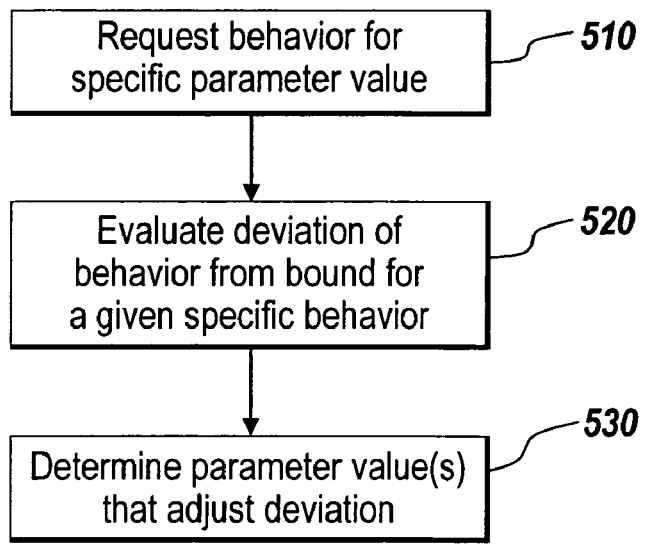
FIG. 5 is an exemplary flowchart depicting one embodiment of the steps involved in modifying the parameter of a modeled system based on a selected bound of graphical representation of the behavior of the system.

FIG. 5 depicts a flowchart 500 of one embodiment of what modifying a parameter based on the deviation may involve. In this embodiment, modifying at least one parameter based on the deviation comprises the following steps: First, the behavior given a specific parameter value is computed from the modeled system (step 510). Next, the deviation of the behavior from the bound is evaluated given a specific behavior (step 520). Finally, a parameter value that adjusts the deviation is determined (step 530). These steps and their interrelations are discussed in more detail below.

Requesting from the modeled system the behavior given a specific parameter value (step 510) involves determining how adjusting or modifying a parameter affects the behavior of the modeled system. A specific value for the parameter is provided and the behavior given that parameter value is determined. In the case where multiple parameters are being modified, the process may be performed for each variable alone and in conjunction with other variables. This is also where any "locked" or limited parameters are considered.

Evaluating the deviation of the behavior from the bound given a specific behavior (step 520) involves comparing the resulting behavior given a specific parameter value against a selected bound. In the case where there are multiple bounds the resulting behavior can be compared to the numerical requirement corresponding to each bound. The resulting deviation determines how close the behavior is to the selected bound.

Determining a parameter value that adjusts the deviation (step 530) may involve performing multiple iterations of the above steps until satisfactory parameter values are found. For example, after the behavior resulting from a specified parameter value is compared to the numerical requirement(s) a new parameter value may be used and the resulting deviation is compared against the previous deviation. Thus the system can be "tweaked," "tuned," or otherwise adjusted to produce the desired resultant behavior.

In embodiments where there are multiple parameters, this process may be repeated for each parameter. Likewise, in embodiments where there are multiple graphical representations of the behavior of the modeled system, this process may be repeated for each graphical representation. In certain embodiments, the number of iterations may be specified. For example, to save computational resources, a max number of iterations may be set for any given process. Likewise, to help ensure a more accurate result a minimum number of iterations may be specified. In some embodiments, the number of iterations may be specified using a graphical user interface (GUI). In other embodiments, the graphical modeling environment or other software on the computing device specifies the number of iterations.

In some embodiments it may be beneficial to separate the formulation of the problem from the solution of the problem. For example one program or routine may be used to set-up or formulate the problem. This program or routine converts the graphical representations of the model, behavior, and bounds into mathematical equations and numerical requirements. Another program or routine may then be used to solve the equations for the numerical requirements and thus optimize the system. Another advantage of this methodology is that different solver programs or routines may then be used depending on the needs of the problem.

Figure 6:
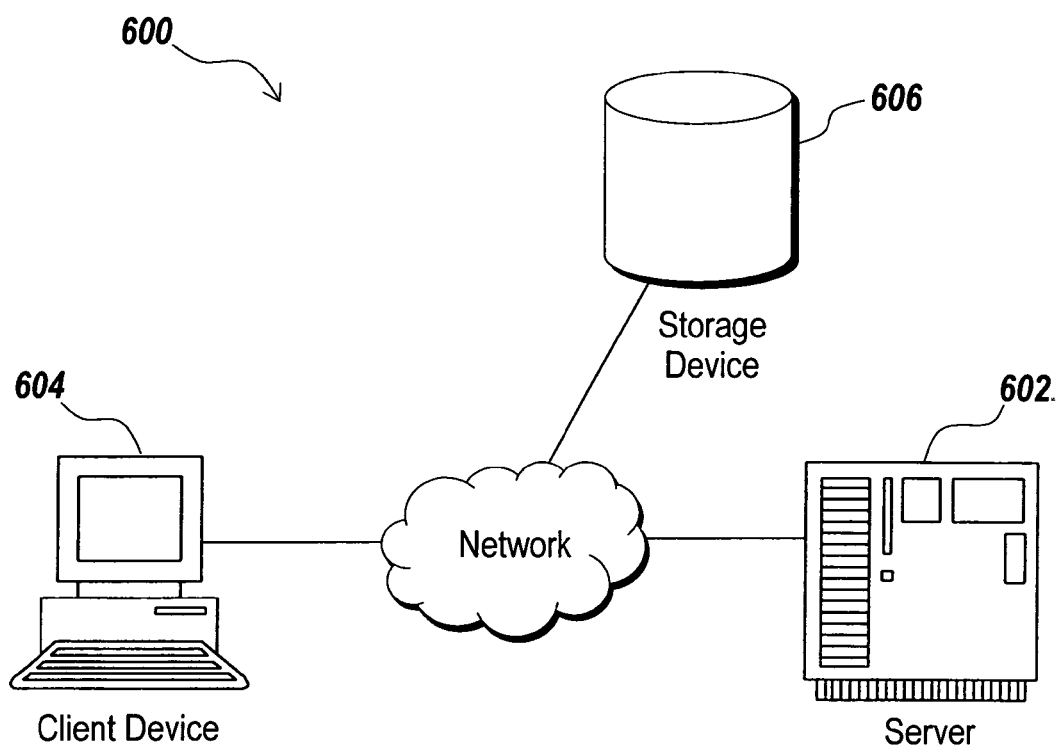
FIG. 6 illustrates a client-server environment suitable for practicing an illustrative embodiment of the present invention.

The examples to this point have focused primarily on the system where the graphical modeling environment was on a local computing device. The graphical modeling environment may also be implemented on a network 600, as illustrated in FIG. 6, having a server 604 and a client device 602. Other devices, such as a storage device 606, may also be connected to the network.

In one such embodiment, the server may execute the graphical modeling environment. A user may then interact with the graphical modeling environment on the server through the client device. In one example of such a system, a server and client device are provided. The server is capable of executing a graphical modeling environment, wherein the graphical modeling environment provides a graphical representation of the behavior of a modeled system wherein the modeled system has at least one parameter that at least in part determines the behavior of the system. The client device is in communication with the server over a network. One or more bounds for the graphical representation of a behavior are selected from the client to the server. At least one parameter of the modeled system is then modified based on the deviation for the graphical representation of the behavior of the modeled system.

It will be understood by one skilled in the art that these network embodiments are exemplary and that the functionality may be divided up in any number of ways over a network.

The proceeding examples have focused primarily on models of control systems in the electrical domain but it will be apparent to one skilled in the art that there are numerous other domains, systems, fields and applications where the present invention would be suitable. Some examples include but are not limited to, models in the mechanical and chemical domains.

The present invention has been described relative to illustrative embodiments. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

What is claimed is:

1. In a graphical modeling environment, a computer-implemented method of modifying a modeled system using a graphical representation of a behavior of the modeled system, the method comprising:

providing in a computer, the graphical representation of the behavior of the modeled system, the modeled system having at least one parameter that at least in part determines the behavior of the modeled system;

selecting, using the computer, at least one bound for the graphical representation of the behavior of the modeled system;

computing, using the computer, a deviation of the graphical representation of the behavior from the bound, wherein the deviation is selected from a group comprising vertical, horizontal, and proximity measures; and modifying the at least one parameter of the modeled system based on the deviation of the graphical representation of the behavior of the modeled system.

2. The method of claim 1, wherein the graphical representation of the behavior of the modeled system is based on multiple inputs to the modeled system.

3. The method of claim 1, wherein the graphical representation of the behavior of the modeled system is based on multiple outputs of the modeled system.

4. The method of claim 1, wherein the graphical representation of the behavior of the modeled system is selected from the group comprising: time domain response, frequency characteristics, pole-zero location, and state space representation.

5. The method of claim 1, wherein multiple graphical representations of the behavior of the modeled system are provided.

6. The method of claim 5, wherein at least one bound is selected for at least one of the provided graphical representations of the behavior of the modeled system and the parameters of the modeled system are modified based the selected bounds for the provided graphical representations of the behavior of the modeled system.

7. The method of claim 1 further comprising generating code from the modeled system using the computer.

8. The method of claim 1 wherein the selected bound comprises a linear bound.

9. The method of claim 1 wherein the selected bound comprises a piece-wise linear bound.

10. The method of claim 1 wherein multiple bounds are selected.

11. The method of claim 10 wherein each of the selected bounds is weighted to give priority to the bound.

12. The method of claim 1 wherein the one or more selected bounds comprise a maximum value for a behavior.

13. The method of claim 1 wherein the one or more selected bounds comprise a minimum value for a behavior.

14. The method of claim 1 wherein the bound selected is determined by the user.

15. The method of claim 1 wherein the bound selected is determined by the graphical representation of the behavior of the modeled system.

16. The method of claim 1 wherein modifying the at least one parameter based on the deviation comprises optimizing the modeled system.

17. The method of claim 1 wherein modifying the at least one parameter based on the deviation comprises:
requesting from the modeled system the behavior for a given specific parameter value;
evaluating the deviation of the behavior from the bound; and
determining a parameter value that adjusts the deviation.

18. A storage medium storing instructions executable by a computing device for performing a method, the method comprising:
generating in the computing device a graphical representation of a behavior of a modeled system, the modeled system having at least one parameter that at least in part determines the behavior of the modeled system;
selecting, using the computing device, at least one bound for the graphical representation of the behavior of the modeled system;
computing, using the computing device, a deviation of the graphical representation of the behavior from the bound, wherein the deviation is selected from a group comprising vertical, horizontal, and proximity measures; and
modifying the at least one parameter of the modeled system based on the deviation of the graphical representation of the behavior of the modeled system.

19. The medium of claim 18, wherein the graphical representation of the behavior of the modeled system is based on multiple inputs to the modeled system.

20. The medium of claim 18, wherein the graphical representation of the behavior of the modeled system is based on multiple outputs of the modeled system.

21. The medium of claim 18, wherein the graphical representation of the behavior of the modeled system is selected from the group comprising: time domain response, frequency characteristics, pole-zero location, and state space characteristics.

22. The medium of claim 18, wherein multiple graphical representations of the behavior of the modeled system are provided.

23. The medium of claim 22, wherein at least one bound is selected and at least one of the provided graphical representations of the behavior of the modeled system and the parameters of the modeled system are modified based the selected bounds for the provided graphical representations of the behavior of the modeled system.

24. The medium of claim 18 further comprising generating code from the modeled system.

25. The medium of claim 18 wherein the selected bound comprises a linear bound.

26. The medium of claim 18 wherein the selected bound comprises a piece-wise linear bound.

27. The medium of claim 18 wherein multiple bounds are selected.

28. The medium of claim 27 wherein each of the selected bounds is weighted to give priority to the bound.

29. The medium of claim 18 wherein the one or more selected bounds comprise a maximum value for a behavior.

30. The medium of claim 18 wherein the one or more selected bounds comprise a minimum value for a behavior.

31. The medium of claim 18 wherein the bound selected is determined by the user.

32. The medium of claim 18 wherein the bound selected is determined by the graphical representation of the behavior of the modeled system.

33. The medium of claim 18 wherein modifying the at least one parameter based on the deviation comprises optimizing the modeled system.

34. The medium of claim 18 wherein modifying the at least one parameter based on the deviation comprises:
requesting from the modeled system the behavior for a given specific parameter value;
evaluating the deviation of the behavior from the bound; and
determining a parameter value that adjusts the deviation.

35. A system for generating and displaying a physical modeling application, comprising:
user-operable input means for inputting data to the physical modeling application;
a display device for displaying a representation of a physical model; and
a computing device including memory for storing computer program instructions and data, and a processor for executing the stored computer program instructions, the computer program instructions including instructions for:
providing a graphical representation of a behavior of a modeled system wherein the modeled system has at least one parameter that at least in part determines the behavior of the modeled system;
selecting at least one bound for the graphical representation of the behavior of the modeled system;
computing a deviation of the graphical representation of the behavior from the bound, wherein the deviation is selected from a group comprising vertical, horizontal, and proximity measures; and
modifying the at least one parameter of the modeled system based on the deviation of the graphical representation of the behavior of the modeled system.

36. The system of claim 35, wherein the graphical representation of the behavior of the modeled system is based on multiple inputs to the modeled system.

37. The system of claim 35, wherein the graphical representation of the behavior of the modeled system is based on multiple outputs of the modeled system.

38. The system of claim 35, wherein the graphical representation of the behavior of the modeled system is selected from the group comprising: time domain response, frequency characteristics, pole-zero location, and state space characteristics.

39. The system of claim 35, wherein multiple graphical representations of the behavior of the modeled system are provided.

40. The system of claim 39, wherein at least one bound is selected for at least one of the provided graphical representations of the behavior of the modeled system and the parameters of the modeled system are modified based the selected bounds for the provided graphical representations of the behavior of the modeled system.

41. The system of claim 35 further comprising generating code from the modeled system.

42. The system of claim 35 wherein the selected bound comprises a linear bound.

43. The system of claim 35 wherein the selected bound comprises a piece-wise linear bound.

44. The system of claim 35 wherein multiple bounds are selected.

45. The system of claim 44 wherein each of the selected bounds is weighted to give priority to the bound.

46. The system of claim 35 wherein the one or more selected bounds comprise a maximum value for a behavior.

47. The system of claim 35 wherein the one or more selected bounds comprise a minimum value for a behavior.

48. The system of claim 35 wherein the bound selected is determined by the user.

49. The system of claim 35 wherein the bound selected is determined by the graphical representation of the behavior of the modeled system.

50. The system of claim 35 wherein modifying the at least one parameter based on the deviation comprises optimizing the modeled system.

51. The system of claim 35 wherein modifying the at least one parameter based on the deviation comprises:
   requesting from the modeled system the behavior for a given specific parameter value;
   evaluating the deviation of the behavior from the bound; and
   determining a parameter value that adjusts the deviation.

52. In a network having a server executing a graphical modeling environment, and a client device in communication with the server, the server executing a method comprising the steps of:
   providing, by the server, a graphical representation of a behavior of a modeled system, for display at the client device, the modeled system having at least one parameter that at least in part determines the behavior of the modeled system;
   receiving, at the server from the client device, a selection of a bound for the graphical representation of the behavior of the modeled system;
   computing, by the server, a deviation of the graphical representation of the behavior from the bound, wherein the deviation is selected from the from a group comprising vertical, horizontal, and proximity measures;
   modifying, by the server, the at least one parameter of the modeled system based on the deviation of the graphical representation of the behavior of the modeled system; and
   providing, by the server, another graphical representation of the behavior of the modeled system, for display at the client device, the another graphical representation of the behavior of the modeled system having been generated by the server using the modified at least one parameter of the modeled system.

53. The method of claim 52, wherein the graphical representation of the behavior of the modeled system is based on multiple inputs to the modeled system.

54. The method of claim 52, wherein the graphical representation of the behavior of the modeled system is based on multiple outputs of the modeled system.

55. The method of claim 52, wherein the graphical representation of the behavior of the modeled system is selected from the group comprising: time domain response, frequency characteristics, pole-zero location, and state space characteristics.

56. The method of claim 52, wherein multiple graphical representations of the behavior of the modeled system are provided.

57. The method of claim 52, wherein at least one bound is selected for at least one of the provided graphical representations of the behavior of the modeled system and the parameters of the modeled system are modified based the selected bounds for the provided graphical representations of the behavior of the modeled system.

58. The method of claim 52 further comprising generating code from the modeled system.

59. The method of claim 52 wherein the selected bound comprises a linear bound.

60. The method of claim 52 wherein the selected bound comprises a piece-wise linear bound.

61. The method of claim 52 wherein multiple bounds are selected.

62. The method of claim 61 wherein each of the selected bounds is weighted to give priority to the bound.

63. The method of claim 52 wherein the one or more selected bounds comprise a maximum value for a behavior.

64. The method of claim 52 wherein the one or more selected bounds comprise a minimum value for a behavior.

65. The method of claim 52 wherein the bound selected is determined by the user.

66. The method of claim 52 wherein the bound selected is determined by the graphical representation of the behavior of the modeled system.

67. The method of claim 52 wherein modifying the at least one parameter based on the deviation comprises optimizing the modeled system.

68. The method of claim 52 wherein modifying the at least one parameter based on the deviation comprises:
   requesting from the modeled system the behavior for a given specific parameter value;
   evaluating the deviation of the behavior from the bound; and
   determining a parameter value that adjusts the deviation.

* * * * *

UNITED STATES PATENT AND TRADEMARK OFFICE
CERTIFICATE OF CORRECTION

| | | |
|---|---|---|
| PATENT NO. | : 7,539,604 B1 | Page 1 of 1 |
| APPLICATION NO. | : 11/253137 | |
| DATED | : May 26, 2009 | |
| INVENTOR(S) | : Alec Stothert et al. | |

It is certified that error appears in the above-identified patent and that said Letters Patent is hereby corrected as shown below:

In Claim 52 (column 13, line 61) of the printed patent, please delete "from the".

Signed and Sealed this

Twenty-first Day of July, 2009

JOHN DOLL
*Acting Director of the United States Patent and Trademark Office*